United States Patent
Na

(10) Patent No.: US 8,344,775 B2
(45) Date of Patent: Jan. 1, 2013

(54) CLOCK DELAY CORRECTING DEVICE AND SEMICONDUCTOR DEVICE HAVING THE SAME

(75) Inventor: Kwang-Jin Na, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 247 days.

(21) Appl. No.: 12/774,602

(22) Filed: May 5, 2010

(65) Prior Publication Data

US 2011/0156784 A1 Jun. 30, 2011

(30) Foreign Application Priority Data

Dec. 30, 2009 (KR) .................. 10-2009-0134332

(51) Int. Cl.
*H03L 7/00* (2006.01)
(52) U.S. Cl. ........................................ 327/161
(58) Field of Classification Search .................... 327/161
See application file for complete search history.

(56) References Cited

U.S. PATENT DOCUMENTS

2008/0048714 A1* 2/2008 Lee et al. .................. 326/30
2008/0063124 A1* 3/2008 Song et al. ................ 375/355

* cited by examiner

*Primary Examiner* — Lincoln Donovan
*Assistant Examiner* — Daniel Rojas
(74) *Attorney, Agent, or Firm* — IP & T Group LLP

(57) ABSTRACT

A semiconductor device includes an on-die termination circuit, a clock input unit, a clock phase mixing unit, and a data input/output unit. The on-die termination circuit is configured to calibrate a resistance of a termination pad and output an impedance matching code. The clock input unit is configured to receive a data clock. The clock phase mixing unit is configured to receive the data clock through the clock input unit and a delayed data clock, which is generated by delaying the data clock by a predetermined time, mix a phase of the data clock and a phase of the delayed data clock at a ratio corresponding to the impedance matching code, and output a phase-mixed data clock. The data input/output unit is configured to input/output a data signal in response to the phase-mixed data clock.

12 Claims, 2 Drawing Sheets

CLOCK DELAY CORRECTING DEVICE AND SEMICONDUCTOR DEVICE HAVING THE SAME

CROSS-REFERENCE TO RELATED APPLICATION

The present application claims priority of Korean Patent Application No. 10-2009-0134332, filed on Dec. 30, 2009, which is incorporated herein by reference in its entirety.

BACKGROUND OF THE INVENTION

Exemplary embodiments of the present invention relate to a semiconductor design technology, and more particularly, to a semiconductor device having a clock delay correcting device which is capable of correcting a phase of a clock used to input and output data according to process, voltage and temperature (PVT) variations.

A system may use a plurality of semiconductor devices to store data. When a data processor, for example, a memory control unit (MCU), requests data, a semiconductor device may output data corresponding to an address inputted from the data processor, or store data provided from the data processor at a position corresponding to the address.

Recently, a high-speed memory device is often designed to input/output two-state data between a rising edge and a falling edge of a system clock applied from the outside, and input/output two-state data between a falling edge and a next rising edge of the system clock. That is, the memory device may be designed to input/output four-state data in one cycle of the system clock.

However, since the system clock has two states, that is, a logic high level and a logic low level, a data clock having two times the frequency of the system clock is required in order to input/output four-state data in one cycle of the system clock. That is, a clock dedicated to data input/output is required.

Therefore, a high-speed semiconductor device uses a system clock as a reference clock when transmitting/receiving an address and a command, and uses a data clock as a reference clock when inputting/outputting data. In this configuration, the data clock has two times frequency of the system clock.

That is, the data clock cycles through two cycles during one cycle of the system clock, and the data are inputted/outputted at a rising edge and a falling edge of the data clock. As such, four-state data are inputted/outputted in one cycle of the system clock.

A high-speed semiconductor device may input/output data by using two clocks having different frequencies for a read or write operation, respectively, as opposed to a conventional DDR synchronous memory device which uses one system clock for a read or write operation.

Here, if the phase of the system clock and the phase of the data clock are not aligned, the reference for transferring an operation command and an address and the reference for transferring a data may not align properly. This means that a high-speed semiconductor device may not operate normally.

Therefore, in order for a high-speed semiconductor device to operate normally, an interface training operation is desired to be performed between a semiconductor device and a data processor in an early stage of operation.

The interface training refers to an operation in which an interface for transferring a command, an address, and a data is trained to operate at an optimized/reasonable timing before a normal operation is performed between the semiconductor device and the data processor.

Such interface training includes an address training, a clock alignment training (WCK2CK training), a read training, and a write training. An operation of aligning a data clock and a system clock is performed in the clock alignment training (WCK2CK training).

FIG. 1 is a timing diagram illustrating a conventional write training operation.

Referring to FIG. 1, an internal data clock (WT SYNC. CLK) for a semiconductor device to receive a write data is a clock generated by compensating an external data clock (EXTERNAL WCLK) for an asynchronous delay of a path through which a clock is transferred inside the semiconductor device.

At this time, the asynchronous delay of the path through which the clock is transferred inside the semiconductor device and for which the external data clock is desired to be compensated, is a value which may vary depending on PVT variations. Therefore, the value may not be previously determinable, and thus may be determined through a write training operation.

After a semiconductor device is supplied with power and starts to operate, a semiconductor device controller (GPU) and a semiconductor device may perform a write training operation. The write training operation is an operation which finds an optimum/desirable write data input timing, at which a sufficient setup/hold time is ensured with reference to the internal data clock, by performing a time sweep (that is, performing tests at various timing points) of a write data with reference to the external data clock in the semiconductor device controller (GPU).

When the semiconductor device performs the write operation at the optimum/desirable write data input timing found through the write training at the early stage of operation, the semiconductor device controller (GPU) transfers the write data to the semiconductor device.

FIG. 2 is a timing diagram illustrating a conventional read training operation.

Referring to FIG. 2, an internal data clock (RD SYNC. CLK) for enabling a semiconductor device controller (GPU) to receive a read data from a semiconductor device is a clock generated by compensating an external data clock (EXTERNAL WCLK) for an asynchronous delay of a path through which a clock is transferred inside the semiconductor device.

At this time, the asynchronous delay of the path through which the clock is transferred inside the semiconductor device and for which the external data clock is desired to be compensated, is a value which may vary depending on PVT variations. Therefore, the value may not be previously determinable, and thus may be determined through a read training operation.

When a semiconductor device is supplied with power and starts to operate, a semiconductor device controller (GPU) and a semiconductor device may perform a read training operation. The read training operation is an operation which finds a timing position of a read strobe signal (GPU READ STROBE), where an optimum/desirable timing in a window period of the read data (data output valid window) can be determined with reference to the internal data clock (RD SYNC. CLK), by performing a time sweep of a read strobe signal (GPU READ STROBE) with reference to the external data clock (EXTERNAL WCLK).

After the semiconductor device performs the read operation for determining the position of the read strobe signal (GPU READ STROBE), at which the optimum/desired timing point in the window period of the read data (data output valid window) is found through the read training operation at the early stage of operation, the semiconductor device controller (GPU) determines the value of the read data transferred from the semiconductor device.

However, a considerable time is taken in completing the above-described write training operation and read training operation. Since the write training operation and the read training operation are performed at the early stage of operation of the semiconductor device, a great variation in an external voltage or an outside temperature during a prolonged operation of the semiconductor device varies a clock delay used to generate the previously determined optimum/desired read/write internal data clocks (RD/WT SYNC. CLK). Therefore, a sufficient setup/hold time may not be ensured at a window period of a write data, and an originally determined timing position of a strobe signal in a window period of a read data (data output valid window) may not be accurate.

SUMMARY OF THE INVENTION

An embodiment of the present invention is directed to a semiconductor device which varies a delay amount between an external data clock (EXTERNAL WCLK) and a read/write internal data clock (RD/WT SYNC. CLK), depending on voltage and temperature (VT) variations of an ambient environment which is caused by a long-terminal operation of the semiconductor device.

In accordance with an embodiment of the present invention, a semiconductor device includes: an on-die termination circuit configured to calibrate a resistance of a termination pad and output an impedance matching code; a clock input unit configured to receive a data clock; a clock phase mixing unit configured to receive the data clock through the clock input unit and a delayed data clock, which is generated by delaying the data clock by a predetermined time, mix a phase of the data clock and a phase of the delayed data clock at a ratio corresponding to the impedance matching code, and output a phase-mixed data clock; and a data input/output unit configured to input/output a data signal in response to the phase-mixed data clock.

DESCRIPTION OF SPECIFIC EMBODIMENTS

Figure 1:
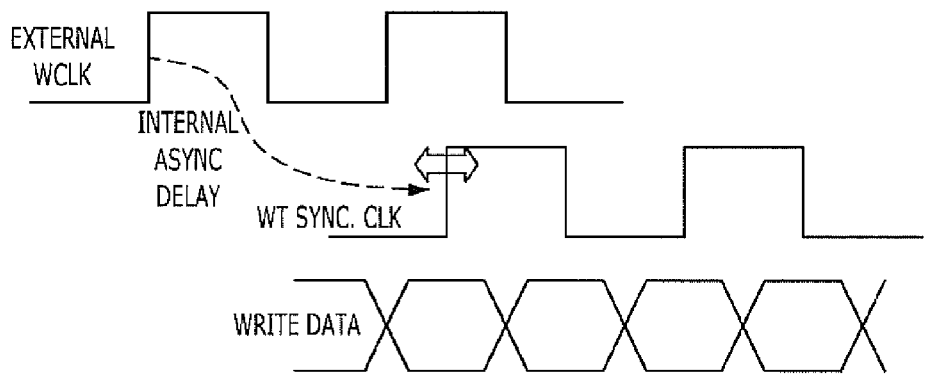
FIG. 1 is a timing diagram illustrating a conventional write training operation.
Figure 2:
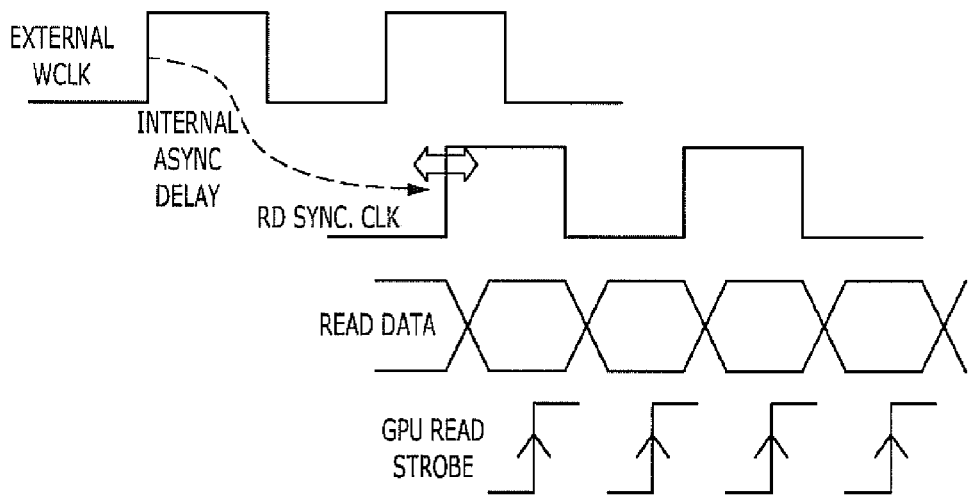
FIG. 2 is a timing diagram illustrating a conventional read training operation.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
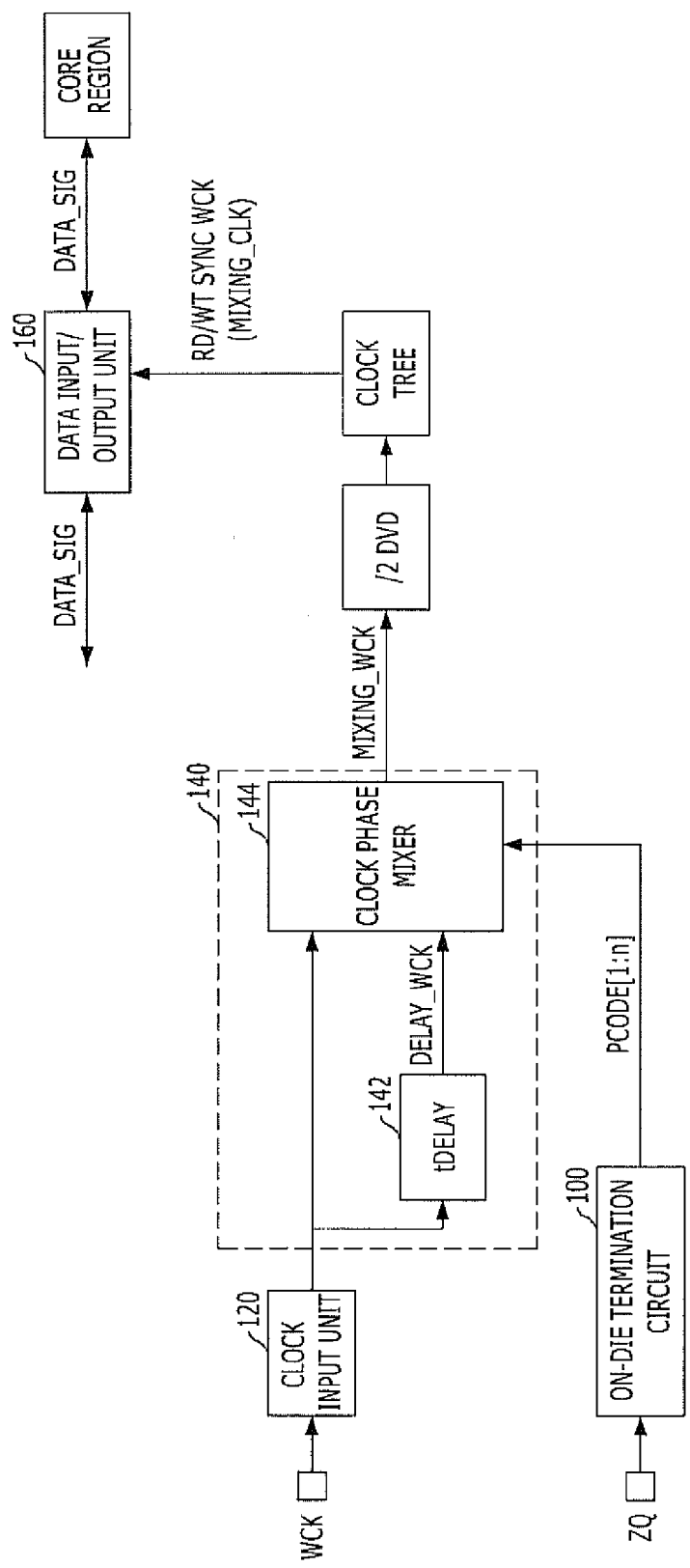
FIG. 3 is a block diagram of a semiconductor device in accordance with an embodiment of the present invention.

FIG. 3 is a block diagram of a semiconductor device in accordance with an embodiment of the present invention.

More specifically, FIG. 3 illustrates an operation in which an external data clock WCK is transferred to the inside of a semiconductor device and converted into an internal data clock (RD/WT SYNC WCK) for inputting/outputting a data signal DATA_SIG.

Here, an asynchronous delay of a clock transfer path inside the semiconductor device, which is to be compensated for the external data clock WCK, occurs in the internal blocks of the semiconductor device illustrated in FIG. 3.

Referring to FIG. 3, the semiconductor device in accordance with an exemplary embodiment of the present invention includes an on-die-termination circuit 100, a clock input unit 120, a clock phase mixing unit 140, and a data input/output unit 160. The on-die termination circuit 100 is configured to calibrate a resistance of a termination pad ZQ and output an impedance matching code PCODE<1:N>. The clock input unit 120 is configured to receive a data clock WCK. The clock phase mixing unit 140 is configured to receive the data clock WCK via the clock input unit 120 and a delayed data clock DELAY_WCK, which is generated by delaying the data clock WCK by a predetermined time tDELAY, mix a phase of the data clock WCK and a phase of the delayed data clock DELAY_WCK at a ratio corresponding to the impedance matching code PCODE<1:N>, and output a phase-mixed data clock MIXING_WCK. The data input/output unit 160 is configured to input/output a data signal DATA_SIG in response to the phase-mixed data clock MIXING_WCK as received by intervening elements /2 DVD and CLOCK TREE. The phase-mixed data clock MIXING_WCK is a clock substantially identical to an internal data clock (RD/WT SYNC WCK).

The clock phase mixing unit 140 includes a clock delay block 142 and a clock phase mixer 144. The clock delay block 142 is configured to delay the data clock WCK by the predetermined time (tDELAY) and generates the delayed data clock DELAY_WCK with the delay. The clock phase mixer 144 is configured to mix the phase of the data clock WCK and the phase of the delayed data clock DELAY_WCK at the ratio corresponding to the impedance matching code PCODE<1:N> and output the phase-mixed data clock MIXING_WCK.

Although not illustrated in detail, the on-die termination circuit 100 adjusts the number of transistors to be turned on among a plurality of transistors coupled in parallel to the termination pad ZQ by varying the value of the impedance matching code PCODE<1:N> so that the resistance of the termination pad ZQ is substantially identical to an external reference resistance.

The resistance of the termination pad ZQ varies depending on the process, voltage and temperature (PVT) variations even when the value of the impedance matching code PCODE<1:N> is fixed. Thus, the resistance of the termination pad ZQ becomes different from the external reference resistance. In response to such a resistance change, the value of the impedance matching code PCODE<1:N> is changed to match the resistance of the termination pad ZQ with the external reference resistance.

As described above, the value of the impedance matching code PCODE<1:N> may be changed depending on the PVT variations of the semiconductor device.

The mixing of the data clock WCK and the delayed data clock DELAY_WCK, which is generated by delaying the data clock WCK by the predetermined time tDELAY, at the ratio corresponding to the PVT variations of the semiconductor device in the clock phase mixing unit 140 means that the mixing ratio of the data clock WCK and the delayed data clock DELAY_CLK is different depending on the PVT variations of the semiconductor device.

For example, as the value of the impedance matching code PCODE<1:N> gets smaller, the clock phase mixer 144 of the clock phase mixing unit 140 drives the data clock WCK received from the clock input unit 120 with a relatively higher driving strength, and drives the delayed data clock DELAY_WCK with a relatively lower driving strength. Therefore, the phase of the phase-mixed data clock MIXING_WCK relatively slightly lags behind the phase of the data clock WCK, and significantly leads the phase of the delayed data clock DELAY_WCK.

On the other hand, when the value of the impedance matching code PCODE<1:N> is larger, the clock phase mixer 144 of the clock phase mixing unit 140 drives the data clock WCK received from the clock input unit 120 with a relatively lower driving strength, and drives the delayed data clock DELAY_WCK with a relatively higher driving strength. Therefore, the phase of the phase-mixed data clock MIXING_WCK significantly lags behind the phase of the data clock WCK, and relatively slightly leads the phase of the delayed data clock DELAY_WCK.

At this time, the frequency of the phase-mixed data clock MIXING_WCK is varied by components (/2 DVD, clock tree, and any other optional circuitry not shown) additionally provided in the semiconductor device, and the phase-mixed data clock MIXING_WCK is further delayed by the same or other components and outputted as the internal data clock (RD/WT SYNC WCK). While the components (/2 DVD, clock tree, and so on) additionally provided in the semiconductor device for varying the frequency and adding delay to the phase-mixed data clock MIXING_WCK are shown as discussed above, other arrangements for varying the frequency and adding delay may also be used depending on various design needs. Even with the above-discussed modifications, the phase-mixed data clock MIXING_WCK and the internal data clock (RD/WT SYNC WCK) may be considered as the substantially same clock.

Here, the internal data clock (RD/WT SYNC WCK) in accordance with the embodiment of the present invention is controlled where a delay of the phase-mixed data clock MIXING_WCK is controlled with respect to the external data clock WCK. Here, as discussed above, in an exemplary embodiment of the present invention, the phase-mixed data clock MIXING_WCK and the internal data clock (RD/WT SYNC WCK) may be considered as the substantially same clock.

Therefore, the operation of inputting/outputting the data signal DATA_SIG in response to the phase-mixed data clock MIXING_WCK in the data input/output unit 160 in accordance with the exemplary embodiment of the present invention may be considered as the substantially same as the operation of inputting/outputting the data signal DATA_SIG in response to the internal data clock (RD/WT SYNC WCK) as illustrated.

As described above, during the operation in which the external data clock WCK passes through the inside of the semiconductor device and is outputted as the internal data clock (RD/WT Sync WCLK), the operation of delaying the data clock WCK by the delay amount varying depending on the impedance matching code PCODE<1:N> is added. Therefore, the delay amount difference between the external data clock WCK and the internal data clock (RD/WT SYNC WCK) may be varied depending on the value of the impedance matching code PCODE<1:N>.

The impedance matching code PCODE<1:N> is a signal used in the on-die termination circuit 100, and its value is varied corresponding to the PVT variations of the semiconductor device.

Thus, in the semiconductor device in accordance with the embodiment of the present invention, the delay between the external data clock WCK and the internal data clock (RD/WT SYNC WCK) may be varied corresponding to the PVT variations of the semiconductor device.

That is, when the PVT variations of the semiconductor device occur, the delay between the external data clock WCK and the internal data clock (RD/WT SYNC WCK) is automatically varied corresponding to the PVT variations of the semiconductor device.

Therefore, when the process, voltage and temperature (PVT) of the ambient environment occur during a prolonged operation of the semiconductor device, the delay between the data clock WCK and the internal data clock (RD/WT SYNC WCK) may be automatically varied, without additionally performing the write training operation and the read training operation. Accordingly, a sufficient setup/hold time is always ensured in the time window of the data signal DATA_SIG inputted corresponding to the internal data clock (RD/WT SYNC WCK). Also, the timing position of the strobe signal for the optimum/desired position of data output valid window may be determined within the output valid window of the data signal DATA_SIG, which is outputted corresponding to the internal data clock (RD/WT SYNC WCK).

When the process, voltage and temperature (PVT) variations of the semiconductor device occur, the delay between the external data clock (EXTERNAL WCLK) and the read/write internal data clock (RD/WT Sync. WCK) is varied in response to the ZQ calibration code of the on-die termination, whose value is varied depending on the PVT variations. Therefore, even though the PVT variations of the semiconductor device occur, the delay between the external data clock (EXTERNAL WCLK) and the read/write internal data clock (RD/WT SYNC. CLK) may substantially maintain an optimum/desired value.

Therefore, a sufficient setup/hold time may be ensured in the write data, without additionally performing the write training operation and the read training operation, even though the PVT variations of the ambient environment occur during a prolonged operation of the semiconductor device. Also, the position of the strobe signal which can determine the optimum/desired value (data output valid window) is determined for the read data.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
an on-die termination circuit configured to calibrate a resistance of a termination pad and output an impedance matching code;
a clock input unit configured to receive a data clock;
a clock phase mixing unit configured to receive the data clock through the clock input unit and a delayed data clock, and to mix a phase of the data clock and a phase of the delayed data clock at a ratio corresponding to the impedance matching code to output a phase-mixed data clock; and
a data input/output unit configured to input/output a data signal in response to the phase-mixed data clock.

2. The semiconductor device of claim 1, wherein the clock phase mixing unit comprises:
a clock delay block configured to delay the data clock by a delay time and generate the delayed data clock; and
a clock phase mixer configured to mix the phase of the data clock and the phase of the delayed data clock at the ratio corresponding to the impedance matching code, and output the phase-mixed data clock.

3. The semiconductor device of claim 2, wherein, as a value of the impedance matching code becomes smaller, the clock phase mixer generates the phase-mixed data clock by driving the data clock with a higher driving strength and driving the delayed data clock with a lower driving strength.

4. The semiconductor device of claim 3, wherein, as the value of the impedance matching code becomes smaller, a lag of the phase of the phase-mixed data clock behind the data clock becomes smaller, and a lead of the phase of the phase-mixed data clock over the phase of the delayed data clock becomes greater.

5. The semiconductor device of claim 3, wherein, as the value of the impedance matching code becomes larger, the clock phase mixer generates the phase-mixed data clock by driving the data clock with a lower driving strength and driving the delayed data clock with a higher driving strength.

6. The semiconductor device of claim 3, wherein, as the value of the impedance matching code becomes larger, a lag of the phase of the phase-mixed data clock behind the data clock becomes greater, and a lead of the phase of the phase-mixed data clock over the phase of the delayed data clock becomes smaller.

7. A clock delay correcting device, comprising:
   an on-die termination circuit configured to calibrate a resistance of a termination pad and output an impedance matching code;
   a clock phase mixing unit configured to receive a data clock and a delayed data clock, and to mix a phase of the data clock and a phase of the delayed data clock at a ratio corresponding to the impedance matching code to output a phase-mixed data clock; and
   a data input/output unit configured to input/output a data signal in response to the phase-mixed data clock.

8. The clock delay correcting device of claim 7, wherein the clock phase mixing unit comprises:
   a clock delay block configured to delay the data clock by a delay time and generate the delayed data clock; and
   a clock phase mixer configured to mix the phase of the data clock and the phase of the delayed data clock at the ratio corresponding to the impedance matching code, and output the phase-mixed data clock.

9. The clock delay correcting device of claim 8, wherein, as a value of the impedance matching code becomes smaller, the clock phase mixer generates the phase-mixed data clock by driving the data clock with a higher driving strength and driving the delayed data clock with a lower driving strength.

10. The clock delay correcting device of claim 9, wherein, as the value of the impedance matching code becomes smaller, a lag of the phase of the phase-mixed data clock behind the data clock becomes smaller, and a lead of the phase of the phase-mixed data clock over the phase of the delayed data clock becomes greater.

11. The clock delay correcting device of claim 9, wherein, as the value of the impedance matching code becomes larger, the clock phase mixer generates the phase-mixed data clock by driving the data clock with a lower driving strength and driving the delayed data clock with a higher driving strength.

12. The clock delay correcting device of claim 9, wherein, as the value of the impedance matching code becomes larger, a lag of the phase of the phase-mixed data clock behind the data clock becomes greater, and a lead of the phase of the phase-mixed data clock over the phase of the delayed data clock becomes smaller.

* * * * *